United States Patent
Zhu et al.

(10) Patent No.: US 10,884,299 B2
(45) Date of Patent: Jan. 5, 2021

(54) DISPLAY MODULE, DISPLAY DEVICE AND OPTICALLY CLEAR ADHESIVE LAYER COMPONENT

(71) Applicants: Beijing BOE Optoelectronics Technology Co., Ltd., Beijing (CN); BOE Technology Group Co., Ltd., Beijing (CN)

(72) Inventors: Jianguo Zhu, Beijing (CN); Fangyi Liu, Beijing (CN); Jie Tang, Beijing (CN); Jianru Yang, Beijing (CN); Le Zhang, Beijing (CN); Yaodong Wang, Beijing (CN); Jiming Zhang, Beijing (CN); Xin Wang, Beijing (CN); Xiaoping Zhang, Beijing (CN); Yangli Zheng, Beijing (CN); Xiaobo Xie, Beijing (CN); Yang Zhang, Beijing (CN); Binbin Liu, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 69 days.

(21) Appl. No.: 16/320,292

(22) PCT Filed: Mar. 30, 2018

(86) PCT No.: PCT/CN2018/081452
§ 371 (c)(1),
(2) Date: Jan. 24, 2019

(87) PCT Pub. No.: WO2019/007113
PCT Pub. Date: Jan. 10, 2019

(65) Prior Publication Data
US 2019/0271892 A1    Sep. 5, 2019

(30) Foreign Application Priority Data

Jul. 5, 2017 (CN) .......................... 2017 1 0543991

(51) Int. Cl.
G02F 1/1345 (2006.01)
G02F 1/1333 (2006.01)
H05K 3/36 (2006.01)

(52) U.S. Cl.
CPC .... *G02F 1/13452* (2013.01); *G02F 1/133308* (2013.01); *H05K 3/361* (2013.01);
(Continued)

(58) Field of Classification Search
None
See application file for complete search history.

(56) References Cited

U.S. PATENT DOCUMENTS

| | | | |
|---|---|---|---|
| 2010/0147582 A1 | 6/2010 | Shin et al. | |
| 2016/0066461 A1* | 3/2016 | Park | H05K 7/20963 361/752 |
| 2017/0123262 A1 | 5/2017 | Lee et al. | |

FOREIGN PATENT DOCUMENTS

| | | |
|---|---|---|
| CN | 2699327 Y | 5/2005 |
| CN | 103364986 A | 10/2013 |
| CN | 107121822 A | 9/2017 |

OTHER PUBLICATIONS

Office Action for corresponding Chinese Application 201710543991.1 dated May 20, 2019.
(Continued)

*Primary Examiner* — Phu Vu
(74) *Attorney, Agent, or Firm* — Arent Fox LLP; Michael Fainberg (57) ABSTRACT

A display module, a display device, and a transparent optical adhesive layer structure are disclosed. The display module comprises a bonding layer for bonding a display panel and
(Continued)

a lamellar structure; the display panel comprises a first substrate and a second substrate arranged oppositely; the first substrate comprises a first extending part beyond the edge of the second substrate; the second substrate is provided close to the bonding layer; the lamellar structure comprises a second extending part beyond the edge of the second substrate; projections of the second extending part and the first extending part on a plane where the first substrate is located are at least in part overlapped; the bonding layer comprises a support part extending between the first extending part and the second extending part.

20 Claims, 5 Drawing Sheets (52) U.S. Cl.
CPC ............ *G02F 2001/133331* (2013.01); *G02F 2202/28* (2013.01)

(56) References Cited

OTHER PUBLICATIONS

International Search Report for PCT/CN2018/081452 dated Jun. 29, 2018.

* cited by examiner

DISPLAY MODULE, DISPLAY DEVICE AND OPTICALLY CLEAR ADHESIVE LAYER COMPONENT

This application is a National Stage of International Application No. PCT/CN2018/081452, filed Mar. 30, 2018, which claims priority to Chinese Patent Application No. 201710543991.1, filed Jul. 5, 2017, both of which are hereby incorporated by reference in their entireties.

FIELD

This disclosure relates to the field of display technologies, and particularly to a display module, a display device and an optically clear adhesive layer component.

BACKGROUND

Along with the rapid development of the display technologies, requirements of people on a display device are becoming higher and higher. At present, the display device such as a mobile phone is developed toward an ultrathin and narrow-bezel direction. In order to implement an ultrathin design, a display panel of the display device is becoming thinner and thinner.

An existing display module generally includes a display panel and a cover plate arranged sequentially, where the display panel includes an array substrate, a color filter substrate, and a liquid crystal layer filled between the array substrate and the color filter substrate. At a terminal side of the display panel, the array substrate includes an electrical connection area beyond an edge of the color filter substrate, where the electrical connection area is used for providing a drive chip and a circuit board. Further, foam is disposed at two sides of the drive chip in general, where the foam is supported between the cover plate and the electrical connection area of the array substrate, and is used for preventing the electrical connection area of the array substrate from being pressed to damage.

The defect of the prior art lies in that when a mechanical test is performed on the display module, since the foam has good elasticity, the foam is deformed easily when being squeezed, thus the supporting effect of the foam is not good enough and therefore a single-layer area of the array substrate is damaged easily. Additionally, an existing foam filling procedure needs a manual operation, which results in that the production efficiency of the display module is relatively low.

SUMMARY

Embodiments of the disclosure provide a display module including a display panel, an adhesive layer and a plate layer component, the adhesive layer is configured to adhere the display panel to the plate layer component; where the display panel includes a first substrate and a second substrate arranged opposite to each other, the first substrate includes a first extension portion beyond an edge of the second substrate, and the second substrate is arranged proximate to the adhesive layer; the plate layer component includes a second extension portion beyond the edge of the second substrate, and projections of the second extension portion and the first extension portion on a plane where the first substrate is located at least overlap partially; and the adhesive layer includes a supporting portion extending to a position between the first extension portion and the second extension portion.

According to the display module of the embodiments of the disclosure, since the supporting portion of the adhesive layer extends to a position between the first extension portion and the second extension portion, compared with the prior art, the supporting portion fills a gap between the first extension portion and the second extension portion, so that the first extension portion can be well supported and protected, and thus the product quality of a display device is improved. In addition, foam does not need to be attached between the first extension portion and the second extension portion, so that the production efficiency of the display device is improved.

In some embodiments of the disclosure, the display panel further includes a drive chip and a first circuit board which are arranged at a side, proximate to the second extension portion, of the first extension portion, the drive chip is electrically connected with the first circuit board, the adhesive layer is provided with an avoidance area opposite to the drive chip and the first circuit board, and a projection of the avoidance area on the plane where the first substrate is located at least partially overlaps with projections of the drive chip and the first circuit board on the plane where the first substrate is located. With the adoption of this structural design, the drive chip and the first circuit board are avoided by the avoidance area of the adhesive layer, so that the squeezing to the drive chip and the first circuit board is reduced.

In some embodiments of the disclosure, the display panel further includes a second circuit board, the second circuit board is arranged on the second substrate and is electrically connected with the second substrate, and the supporting portion is located between the second circuit board and the second extension portion. With the adoption of this structural design, the second circuit board is electrically connected with the second substrate, and the supporting portion of the adhesive layer and the second circuit board are jointly supported between the plate layer component and the first extension portion, so the first extension portion can be well supported and protected.

In some embodiments of the disclosure, the supporting portion is provided with a protruding platform component facing the first extension portion. With the adoption of this protruding platform component, the gap between the plate layer component and the first extension portion can be filled, thereby improving the supporting effect of the supporting portion.

In some embodiments of the disclosure, the protruding platform component includes two protruding platform elements, and the two protruding platform elements are respectively arranged at two sides of the drive chip.

In some embodiments of the disclosure, a section, obtained by truncating the protruding platform component by a section parallel to the second substrate, of the protruding platform component shapes as a rectangle, a circle or a triangle.

In some embodiments of the disclosure, the plate layer component is a cover plate; or, the plate layer component is a touch panel.

In some embodiments of the disclosure, the adhesive layer is an optically clear adhesive layer.

In some embodiments of the disclosure, the display panel further includes a circuit board protective layer covering the first circuit board and avoiding the drive chip. The circuit board protective layer covers the first circuit board, so the first circuit board can be prevented from being scratched or squeezed when the display panel is transported or tested.

In some embodiments of the disclosure, the display panel further includes a polarizer arranged between the second substrate and the adhesive layer.

The embodiments of the disclosure further provide a display device including the display module above according to any one of the embodiments of the disclosure.

According to the display device of the embodiments of the disclosure, since a supporting portion of an adhesive layer extends to a position between a first extension portion and a second extension portion, compared with the prior art, the supporting portion fills a gap between the first extension portion and the second extension portion, so that the first extension portion can be well supported and protected, and thus the product quality of the display device is improved. In addition, foam does not need to be attached between the first extension portion and the second extension portion, so that the production efficiency of the display device is improved.

The embodiments of the disclosure further provide an optically clear adhesive layer component including an adhesive layer body for adhering a display panel to a plate layer component; where the display panel includes a first substrate and a second substrate arranged opposite to each other, the first substrate includes a first extension portion beyond an edge of the second substrate, a drive chip and a first circuit board are arranged at a side, proximate to the second substrate, of the first extension portion, the drive chip is electrically connected with the first circuit board, and the second substrate is arranged proximate to the adhesive layer body; the plate layer component includes a second extension portion beyond the edge of the second substrate, and projections of the second extension portion and the first extension portion on a plane where the first substrate is located at least overlap partially; and the adhesive layer body includes a supporting portion extending to a position between the first extension portion and the second extension portion, and is provided with an avoidance area opposite to the drive chip and the first circuit board; and a projection of the avoidance area on the plane where the first substrate is located at least partially overlaps with projections of the drive chip and the first circuit board on the plane where the first substrate is located.

When the optically clear adhesive layer component according to the embodiments of the disclosure is applied to a display module, since the supporting portion of the optically clear adhesive layer component extends to a position between the first extension portion and the second extension portion, compared with the prior art, the supporting portion fills a gap between the first extension portion and the second extension portion, so that the first extension portion can be well supported and protected, and thus the product quality of the display device is improved. In addition, foam does not need to be attached between the first extension portion and the second extension portion, so that the production efficiency of the display device is improved.

In some embodiments of the disclosure, the supporting portion is provided with a protruding platform component facing the first extension portion.

In some embodiments of the disclosure, the protruding platform component includes two protruding platform elements, and the two protruding platform elements are respectively arranged at two sides of the drive chip.

In some embodiments of the disclosure, a section, obtained by truncating the protruding platform component by a section parallel to the second substrate, of the protruding platform component shapes as a rectangle, a circle or a triangle.

DETAILED DESCRIPTION OF THE EMBODIMENTS

Figure 1:
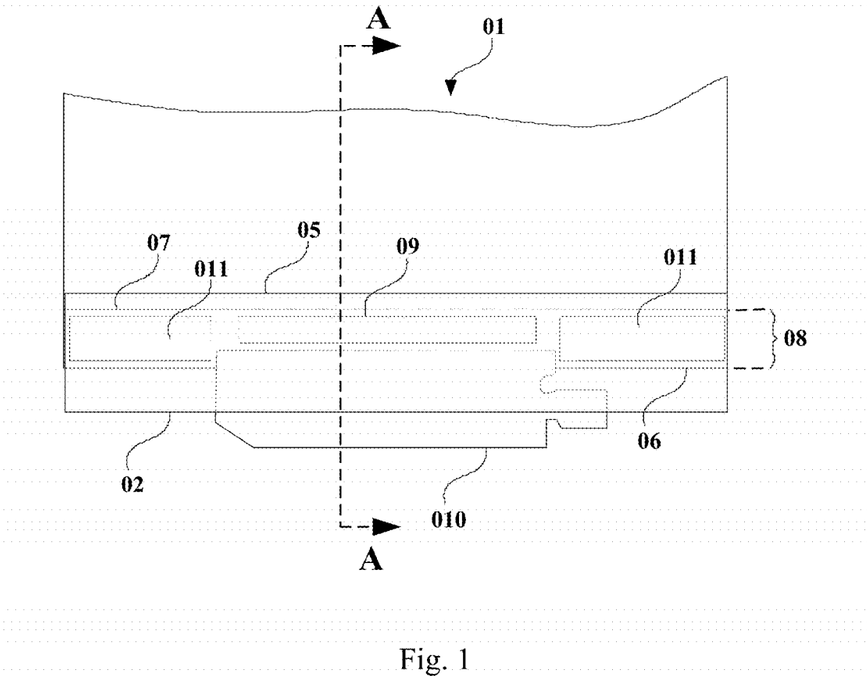
FIG. 1 is a local top view of a display module in the prior art.
Figure 2:
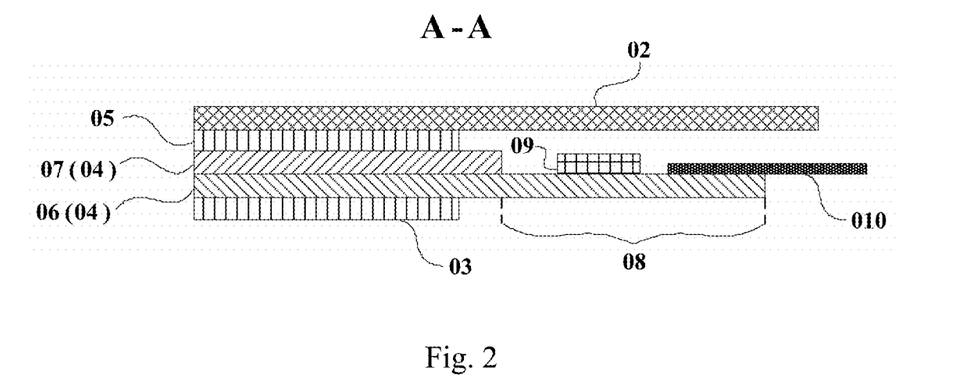
FIG. 2 is a schematic diagram of an A-A section in FIG. 1.

In an existing solution of a display module, as illustrated in FIG. 1 and FIG. 2, a main structure of the display module includes: a display panel 01 and a cover plate 02 arranged sequentially; where the display panel 01 includes a first polarizer 03, a liquid crystal cell 04 and a second polarizer 05 arranged in that order; and the liquid crystal cell 04 includes an array substrate 06 and a color filter substrate 07 which are box aligned, as well as a liquid crystal layer (not illustrated in figure) filled between the array substrate 06 and the color filter substrate 07. At a terminal side of the display panel 01, the array substrate 06 includes an electrical connection area 08 beyond an edge of the color filter substrate 07, and the electrical connection area 08 is used for providing a drive chip 09, a circuit board 010 connected with the drive chip 09, and foam 011 located at two sides of the drive chip 09. In the display module, the foam 011 is deformed very easily when being squeezed, so that the supporting effect is not good enough and thus a single-layer area of the array substrate 06 is squeezed easily to damage. In addition, the foam 011 is filled via a manual operation, so the production efficiency of the display module is relatively low.

In order to improve the product quality and the production efficiency of the display device, the embodiments of the disclosure provide a display module, a display device and an optically clear adhesive layer component. In order to make the objects, technical solutions and advantages of the embodiments of the disclosure more apparent, the technical solutions according to the embodiments of the disclosure will be described below clearly and fully with some embodiments.

A First Embodiment

Figure 3:
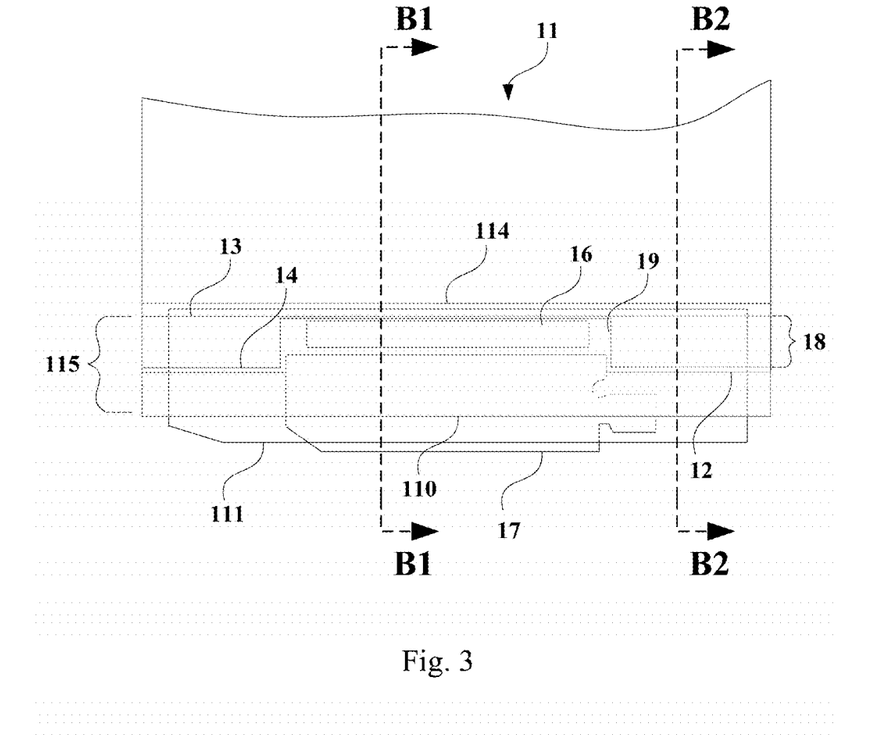
FIG. 3 is a local top view of a display module in a first embodiment of the disclosure.
Figure 4:
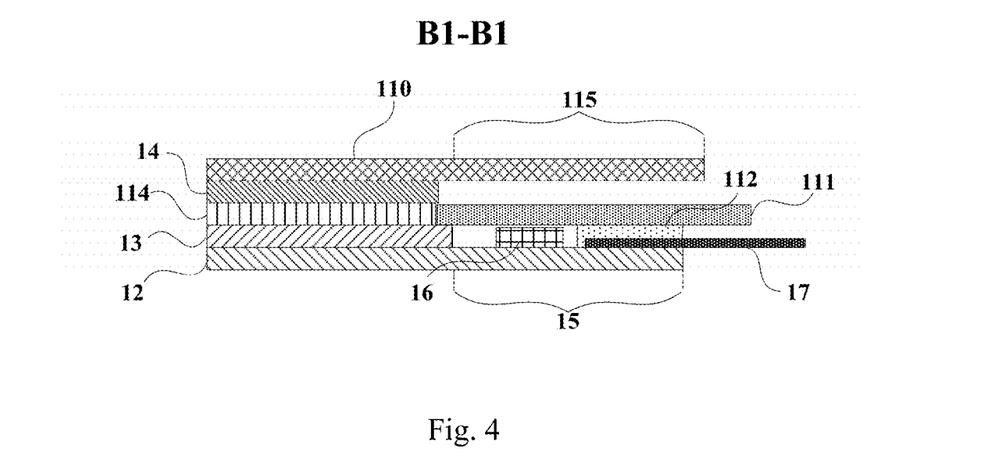
FIG. 4 is a schematic diagram of a B1-B1 section in FIG. 3.
Figure 5:
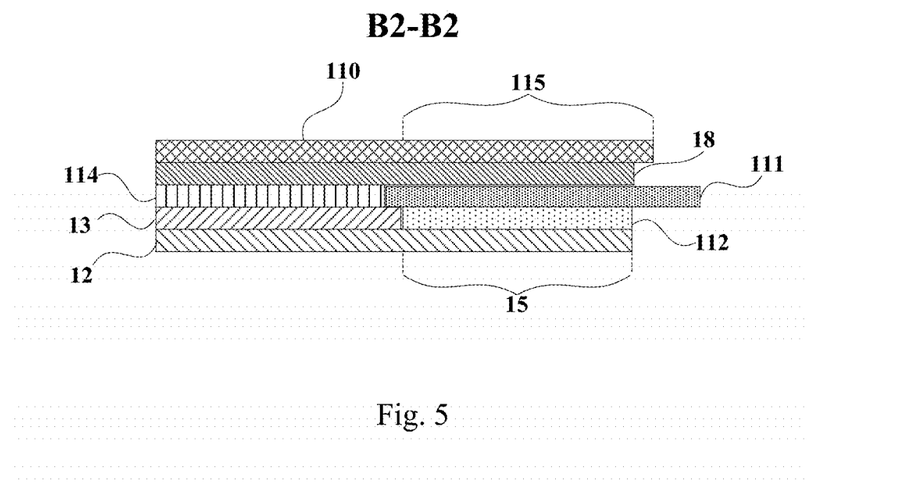
FIG. 5 is a schematic diagram of a B2-B2 section in FIG. 3.

As illustrated in FIG. 3 to FIG. 5, the first embodiment of the disclosure provides a display module, which includes a display panel 11, an adhesive layer 14 and a plate layer component 110 arranged in that order, and the adhesive layer 14 is configured to adhere the display panel 11 to the plate layer component 110; where the display panel 11 includes a first substrate 12 and a second substrate 13 arranged opposite to each other, the first substrate 12 includes a first extension portion 15 beyond an edge of the second substrate 13, and the second substrate 13 is arranged proximate to the adhesive layer 14; the plate layer component 110 includes a second extension portion 115 beyond the edge of the second substrate 13 and opposite to the first extension portion 15, i.e., projections of the second extension portion 115 and the first extension portion 15 on a plane where the first substrate 12 is located at least overlap partially; and the adhesive layer 14 includes a supporting portion 18 extending to a position between the first extension portion 15 and the second extension portion 115.

According to the display module of the embodiment of the disclosure, since the supporting portion 18 of the adhesive layer 14 extends to a position between the first extension portion 15 and the second extension portion 115, compared with the prior art, the supporting portion 18 fills a gap between the first extension portion 15 and the second extension portion 115, so that the first extension portion 15 can be well supported and protected, and thus the product quality of a display device is improved. In addition, foam does not need to be manually attached between the first extension portion 15 and the second extension portion 115, so that the production efficiency of the display device is improved.

In the embodiment of the disclosure, the plate layer component 110 can be a cover plate, or a touch panel.

As illustrated in FIG. 4, in this embodiment, the display panel 11 further includes a drive chip 16 and a first circuit board 17 which are arranged at a side, proximate to the second extension portion 115, of the first extension portion 15, the drive chip 16 is electrically connected with the first circuit board 17, the supporting portion 18 is provided with an avoidance area 19 opposite to the drive chip 16 and the first circuit board 17, and a projection of the avoidance area 19 on the plane where the first substrate 12 is located at least partially overlaps with projections of the drive chip 16 and the first circuit board 17 on the plane where the first substrate 12 is located. Optionally, the projection of the avoidance area 19 on the plane where the first substrate 12 is located completely covers the projections of the drive chip 16 and the first circuit board 17 on the plane where the first substrate 12 is located. With the adoption of this structural design, the drive chip 16 and the first circuit board 17 are avoided by the avoidance area 19 of the adhesive layer 14, so that the squeezing to the drive chip 16 and the first circuit board 17 is reduced.

Referring to FIG. 4 continuously, the display panel 11 further includes a second circuit board 111 arranged at a side, away from the first extension portion 15, of the drive chip 16 and the first circuit board 17, the second circuit board 111 is electrically connected with the second substrate 13, and the supporting portion 18 is located between the second circuit board 111 and the second extension portion 115. In this embodiment, the second circuit board 111 is electrically connected with the second substrate 13, and the supporting portion 18 of the adhesive layer 14 and the second circuit board 111 are jointly supported between the plate layer component 110 and the first extension portion 15, so the first extension portion 15 can be well supported and protected.

As illustrated in FIG. 4 and FIG. 5, optionally, the display panel 11 further includes a circuit board protective layer 112 covering the first circuit board 17 and avoiding the drive chip 16. The circuit board protective layer 112 covers the first circuit board 17, so the first circuit board 17 can be prevented from being scratched or squeezed when the display panel 11 is transported or tested.

In this embodiment, as illustrated in FIG. 4, the display panel 11 further includes a polarizer 114 arranged between the second substrate 13 and the adhesive layer 14. In this embodiment, the supporting portion 18 is filled between the plate layer component 110 and the first extension portion 15 to form a closed space, thereby supporting and protecting the first extension portion 15.

In the embodiment of the disclosure, the adhesive layer 14 can be made of an optical adhesive, for example, in an optional embodiment of the disclosure, the adhesive layer 14 is an optically clear adhesive layer.

A Second Embodiment

Figure 6:
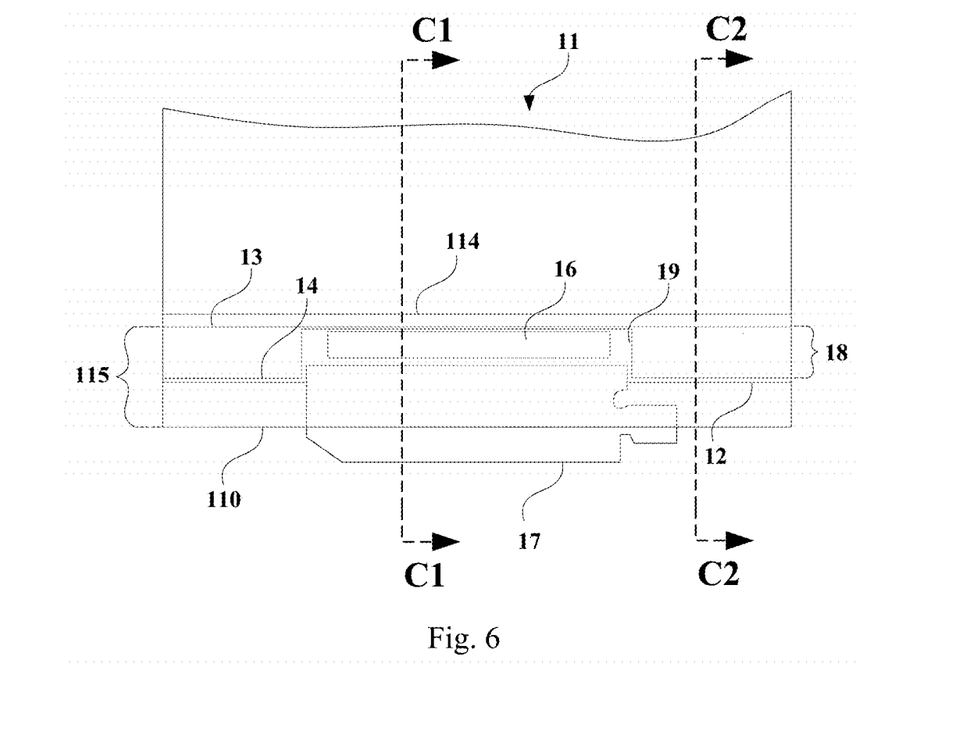
FIG. 6 is a local top view of a display module in a second embodiment of the disclosure.
Figure 7:
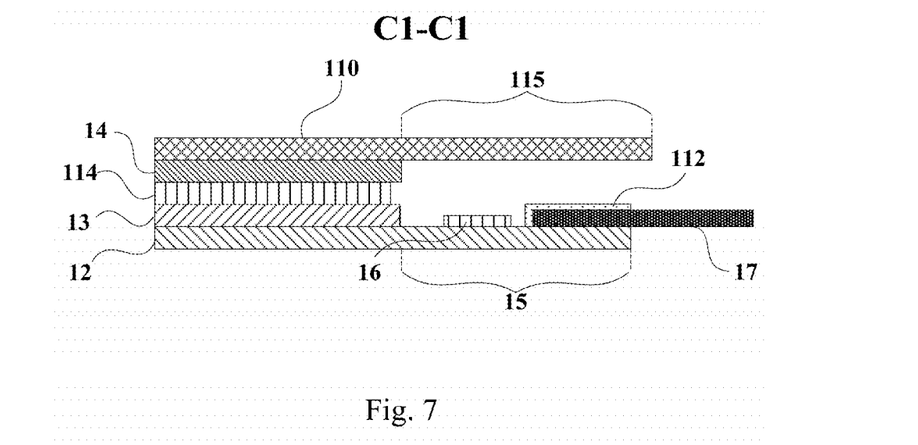
FIG. 7 is a schematic diagram of a C1-C1 section in FIG. 6.
Figure 8:
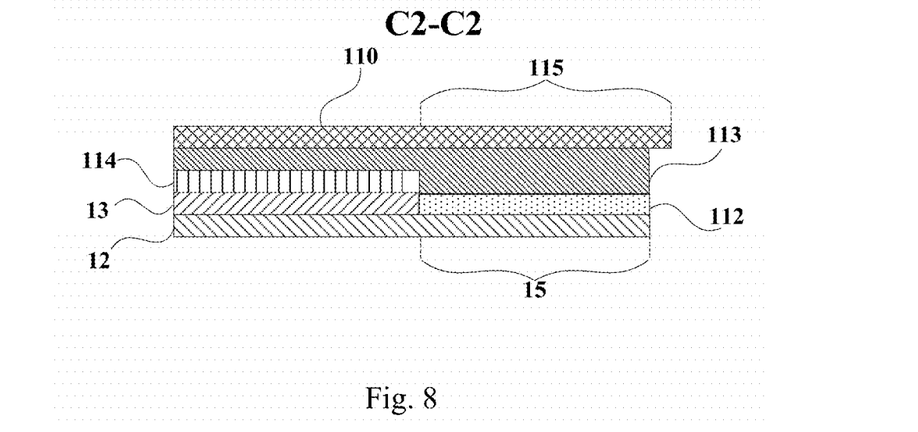
FIG. 8 is a schematic diagram of a C2-C2 section in FIG. 6.

As illustrated in FIG. 6 to FIG. 8, the second embodiment of the disclosure provides a display module, which includes a display panel 11, an adhesive layer 14 and a plate layer component 110 arranged in that order, and the adhesive layer 14 is configured to adhere the display panel 11 to the plate layer component 110, where the display panel 11 includes a first substrate 12 and a second substrate 13 arranged opposite to each other, the first substrate 12 includes a first extension portion 15 beyond an edge of the second substrate 13, and the second substrate 13 is arranged proximate to the adhesive layer 14; the plate layer component 110 includes a second extension portion 115 beyond the edge of the second substrate 13 and opposite to the first extension portion 15; and the adhesive layer 14 includes a supporting portion 18 extending to a position between the first extension portion 15 and the second extension portion 115.

According to the display module of the embodiment of the disclosure, since the supporting portion 18 of the adhesive layer 14 extends to a position between the first extension portion 15 and the second extension portion 115, compared with the prior art, the supporting portion 18 fills a gap between the first extension portion 15 and the second extension portion 115, so that the first extension portion 15 can be well supported and protected, and thus the product quality of a display device is improved. In addition, foam does not need to be manually attached between the first extension portion 15 and the second extension portion 115, so that the production efficiency of the display device is improved.

In the embodiment of the disclosure, the plate layer component 110 can be a cover plate, or a touch panel.

As illustrated in FIG. 7, in this embodiment, optionally, the display panel 11 further includes a drive chip 16 and a first circuit board 17 which are arranged at a side, proximate to the second extension portion 115, of the first extension portion 15; the drive chip 16 is electrically connected with the first circuit board 17; and the supporting portion 18 is provided with an avoidance area 19 opposite to the drive chip 16 and the first circuit board 17. With the adoption of this structural design, the drive chip 16 and the first circuit board 17 are avoided by the avoidance area 19 of the adhesive layer 14, so that the squeezing to the drive chip 16 and the first circuit board 17 is reduced.

As illustrated in FIG. 6 and FIG. 7, optionally, the display panel 11 further includes a circuit board protective layer 112 covering the first circuit board 17 and avoiding the drive chip 16. The circuit board protective layer 112 covers the first circuit board 17, so the first circuit board 17 can be prevented from being scratched or squeezed when the display panel 11 is transported or tested.

As illustrated in FIG. 8, in this embodiment of the disclosure, optionally, the supporting portion 18 is provided with a protruding platform component 113 facing the first extension portion 15. The gap between the plate layer component 110 and the first extension portion 15 can be filled by the protruding platform component 113, thereby further enhancing the supporting effect of the supporting portion 18.

In this embodiment of the disclosure, optionally, the protruding platform component 113 includes two protruding platform elements, and the two protruding platform elements are respectively arranged at two sides of the drive chip 16. With the adoption of this structural design, the process operation is simple and convenient.

A section, obtained by truncating the protruding platform component 113 by a section parallel to the second substrate 13, of the protruding platform component 113 is not limited in shape, for example, the section of the protruding platform component 113 may be in a rectangular shape, a circular shape or a triangular shape.

In this embodiment, as illustrated in FIG. 8, the display panel 11 further includes a polarizer 114 arranged between the second substrate 13 and the adhesive layer 14. In this embodiment, the supporting portion 18 is filled between the plate layer component 110 and the first extension portion 15 to form a closed space, thereby supporting and protecting the first extension portion 15.

In this embodiment of the disclosure, the adhesive layer 14 can be made of an optical adhesive, for example, in an optional embodiment of the disclosure, the adhesive layer 14 is an optically clear adhesive layer.

A Third Embodiment

The third embodiment of the disclosure provides a display device, which includes the display module according to the first embodiment or the second embodiment of the disclosure.

According to the display device of the embodiment of the disclosure, since a supporting portion 18 of an adhesive layer 14 extends to a position between a first extension portion 15 and a second extension portion 115, compared with the prior art, the supporting portion 18 fills a gap between the first extension portion 15 and the second extension portion 115, so that the first extension portion 15 can be well supported and protected, and thus the product quality of the display device is improved. In addition, foam does not need to be manually attached between the first extension portion 15 and the second extension portion 115, so that the production efficiency of the display device is improved.

A Fourth Embodiment

Figure 9:
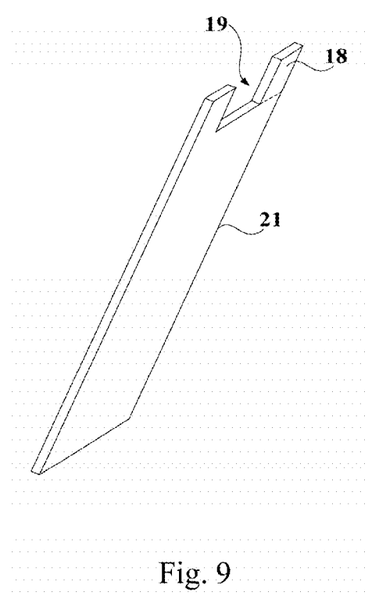
FIG. 9 is a schematic diagram of an optically clear adhesive layer component in a fourth embodiment of the disclosure.

As illustrated in FIG. 9, the fourth embodiment of the disclosure provides an optically clear adhesive layer component, which includes an adhesive layer body 21 for adhering a display panel 11 to a plate layer component 110, where the display panel 11 includes a first substrate 12 and a second substrate 13 arranged opposite to each other, the first substrate 12 includes a first extension portion 15 beyond an edge of the second substrate 13, a drive chip 16 and a first circuit board 17 are arranged at a side, proximate to the second substrate 13, of the first extension portion 15, the drive chip 16 is connected with the first circuit board 17, and the second substrate 13 is arranged proximate to the adhesive layer body 21; the plate layer component 110 includes a second extension portion 115 beyond the edge of the second substrate 13 and opposite to the first extension portion 15, i.e., projections of the second extension portion 115 and the first extension portion 15 on a plane where the first substrate 12 is located at least overlap partially; and the adhesive layer body 21 includes a supporting portion 18 extending to a position between the first extension portion 15 and the second extension portion 115, and is provided with an avoidance area 19 opposite to the drive chip 16 and the first circuit board 17, and a projection of the avoidance area 19 on the plane where the first substrate 12 is located at least partially overlaps with projections of the drive chip 16 and the first circuit board 17 on the plane where the first substrate 12 is located. Optionally, the projection of the avoidance area 19 on the plane where the first substrate 12 is located completely covers the projections of the drive chip 16 and the first circuit board 17 on the plane where the first substrate 12 is located.

When the optically clear adhesive layer component according to this embodiment of the disclosure is applied to a display module, since the supporting portion 18 of the optically clear adhesive layer component extends to a position between the first extension portion 15 and the second extension portion 115, compared with the prior art, the supporting portion 18 fills a gap between the first extension portion 15 and the second extension portion 115, so that the first extension portion 15 can be well supported and protected, and thus the product quality of the display device is improved. In addition, foam does not need to be manually attached between the first extension portion 15 and the second extension portion 115, so that the production efficiency of the display device is improved.

Figure 10:
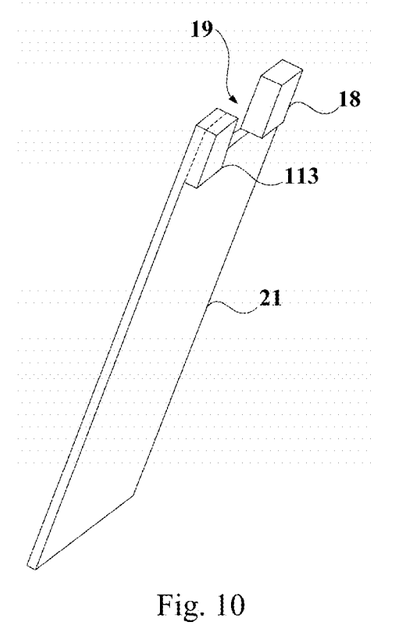
FIG. 10 is a schematic diagram of another optically clear adhesive layer component in the fourth embodiment of the disclosure.

As illustrated in FIG. 10, in this embodiment of the disclosure, optionally, the supporting portion 18 is provided with a protruding platform component 113 facing the first extension portion. The gap between the plate layer component 110 and the first extension portion 15 may be filled by the protruding platform component 113, thereby further enhancing the supporting effect of the supporting portion 18.

In this embodiment of the disclosure, optionally, the protruding platform component 113 includes two protruding platform elements; and the two protruding platform elements are respectively arranged at two sides of the drive chip 16.

A section, obtained by truncating the protruding platform component 113 by a section parallel to the second substrate 13, of the protruding platform component 113 is not limited in shape, for example, the section of the protruding platform component 113 may be in a rectangular shape, a circular shape or a triangular shape.

Evidently those skilled in the art can make various modifications and variations to the disclosure without departing from the spirit and scope of the disclosure. Accordingly the disclosure is also intended to encompass these modifications and variations thereto so long as the modifications and variations come into the scope of the claims appended to the disclosure and their equivalents.

The invention claimed is:

1. A display module, comprising a display panel, an adhesive layer and a plate layer component, the adhesive layer is configured to adhere the display panel to the plate layer component, wherein:

the display panel comprises a first substrate and a second substrate arranged opposite to each other, the first substrate comprises a first extension portion beyond an edge of the second substrate, and the second substrate is arranged proximate to the adhesive layer;

the plate layer component comprises a second extension portion beyond the edge of the second substrate, and projections of the second extension portion and the first extension portion on a plane where the first substrate is located at least overlap partially; and the adhesive layer comprises a supporting portion extending to a position between the first extension portion and the second extension portion;

the display panel further comprises a drive chip and a first circuit board which are arranged at a side, proximate to the second extension portion, of the first extension portion;

the drive chip is electrically connected with the first circuit board, the adhesive layer is provided with an avoidance area opposite to the drive chip and the first circuit board, and a projection of the avoidance area on the plane where the first substrate is located at least partially overlaps with projections of the drive chip and the first circuit board on the plane where the first substrate is located.

2. The display module according to claim 1, wherein the display panel further comprises a second circuit board arranged on the second substrate and electrically connected with the second substrate, and the supporting portion is located between the second circuit board and the second extension portion.

3. The display module according to claim 1, wherein the supporting portion is provided with a protruding platform component facing the first extension portion.

4. The display module according to claim 3, wherein the protruding platform component comprises two protruding platform elements and the two protruding platform elements are respectively arranged at two sides of the drive chip.

5. The display module according to claim 3, wherein a section, obtained by truncating the protruding platform component by a section parallel to the second substrate, of the protruding platform component shapes as a rectangle, a circle or a triangle.

6. The display module according to claim 1, wherein the plate layer component is a cover plate or a touch panel.

7. The display module according to claim 1, wherein the adhesive layer is an optically clear adhesive layer.

8. The display module according to claim 1, wherein the display panel further comprises a circuit board protective layer covering the first circuit board and avoiding the drive chip.

9. The display module according to claim 8, wherein the display panel further comprises a polarizer arranged between the second substrate and the adhesive layer.

10. A display device, comprising a display module; wherein the display module comprises a display panel, an adhesive layer and a plate layer component, the adhesive layer is configured to adhere the display panel to the plate layer component, wherein:

the display panel comprises a first substrate and a second substrate arranged opposite to each other, the first substrate comprises a first extension portion beyond an edge of the second substrate, and the second substrate is arranged proximate to the adhesive layer;

the plate layer component comprises a second extension portion beyond the edge of the second substrate, and projections of the second extension portion and the first extension portion on a plane where the first substrate is located at least overlap partially; and the adhesive layer comprises a supporting portion extending to a position between the first extension portion and the second extension portion;

wherein the display panel further comprises a drive chip and a first circuit board which are arranged at a side, proximate to the second extension portion, of the first extension portion;

the drive chip is electrically connected with the first circuit board, the adhesive layer is provided with an avoidance area opposite to the drive chip and the first circuit board, and a projection of the avoidance area on the plane where the first substrate is located at least partially overlaps with projections of the drive chip and the first circuit board on the plane where the first substrate is located.

11. An optically clear adhesive layer component, comprising an adhesive layer body for adhering a display panel to a plate layer component, wherein:

the display panel comprises a first substrate and a second substrate arranged opposite to each other, the first substrate comprises a first extension portion beyond an edge of the second substrate, a drive chip and a first circuit board are arranged at a side, proximate to the second substrate, of the first extension portion, the drive chip is electrically connected with the first circuit board, and the second substrate is arranged proximate to the adhesive layer body;

the plate layer component comprises a second extension portion beyond the edge of the second substrate, and projections of the second extension portion and the first extension portion on a plane where the first substrate is located at least overlap partially; and the adhesive layer body comprises a supporting portion extending to a position between the first extension portion and the second extension portion, and is provided with an avoidance area opposite to the drive chip and the first circuit board, and a projection of the avoidance area on the plane where the first substrate is located at least partially overlaps with projections of the drive chip and the first circuit board on the plane where the first substrate is located.

12. The optically clear adhesive layer component according to claim 11, wherein the supporting portion is provided with a protruding platform component facing the first extension portion.

13. The optically clear adhesive layer component according to claim 12, wherein the protruding platform component comprises two protruding platform elements and the two protruding platform elements are respectively arranged at two sides of the drive chip.

14. The optically clear adhesive layer component according to claim 12, wherein a section, obtained by truncating the protruding platform component by a section parallel to the second substrate, of the protruding platform component shapes as a rectangle, a circle or a triangle.

15. The display device according to claim 10, wherein the display panel further comprises a second circuit board arranged on the second substrate and electrically connected with the second substrate, and the supporting portion is located between the second circuit board and the second extension portion.

16. The display device according to claim 10, wherein the supporting portion is provided with a protruding platform component facing the first extension portion.

17. The display device according to claim 16, wherein the protruding platform component comprises two protruding platform elements and the two protruding platform elements are respectively arranged at two sides of the drive chip.

18. The display device according to claim 10, wherein the display panel further comprises a circuit board protective layer covering the first circuit board and avoiding the drive chip.

19. The display module according to claim 16, wherein a section, obtained by truncating the protruding platform component by a section parallel to the second substrate, of the protruding platform component shapes as a rectangle, a circle or a triangle.

20. The display module according to claim 10, wherein the display panel further comprises a polarizer arranged between the second substrate and the adhesive layer.

* * * * *

UNITED STATES PATENT AND TRADEMARK OFFICE
CERTIFICATE OF CORRECTION

PATENT NO. : 10,884,299 B2  
APPLICATION NO. : 16/320292  
DATED : January 5, 2021  
INVENTOR(S) : Jianguo Zhu Page 1 of 1

It is certified that error appears in the above-identified patent and that said Letters Patent is hereby corrected as shown below:

On the Title Page

(73) Assignee Reads:  
BOE TECHNOLOGY GROUP CO., LTD., Beijing (CN);  
HEFEI BOE OPTOELECTRONICS TECHNOLOGY CO., LTD., Anhui (CN)

Should Read:  
BOE TECHNOLOGY GROUP CO., LTD., Beijing (CN);  
BEIJING BOE OPTOELECTRONICS TECHNOLOGY CO., LTD., Beijing (CN)

Signed and Sealed this  
Fifteenth Day of June, 2021

Drew Hirshfeld  
*Performing the Functions and Duties of the*  
*Under Secretary of Commerce for Intellectual Property and*  
*Director of the United States Patent and Trademark Office*